US012688953B2

(12) United States Patent　　　　　(10) Patent No.:　　US 12,688,953 B2
Hsieh et al.　　　　　　　　　　　　(45) Date of Patent:　　　Jul. 21, 2026

(54) IMMERSION COOLING SYSTEM AND FEEDTHROUGH MODULE THEREOF

(71) Applicant: Wiwynn Corporation, New Taipei City (TW)

(72) Inventors: Hsien-Chieh Hsieh, New Taipei City (TW); Ting-Ya Liao, New Taipei City (TW)

(73) Assignee: Wiwynn Corporation, New Taipei City (TW)

( * ) Notice: Subject to any disclaimer, the term of this patent is extended or adjusted under 35 U.S.C. 154(b) by 362 days.

(21) Appl. No.: 18/371,458

(22) Filed: Sep. 22, 2023

(65) Prior Publication Data

US 2025/0104891 A1　　Mar. 27, 2025

(51) Int. Cl.
　　*H01B 17/30*　　　　(2006.01)
　　*H02G 5/10*　　　　(2006.01)
　　*H05K 7/20*　　　　(2006.01)
(52) U.S. Cl.
　　CPC .............. *H01B 17/30* (2013.01); *H02G 5/10* (2013.01); *H05K 7/20236* (2013.01); *H05K 7/20272* (2013.01)
(58) Field of Classification Search
　　CPC ...... H01B 17/30; H02G 5/10; H05K 7/20236; H05K 7/20272; H05K 7/203; H05K 7/20

USPC ......................................................... 174/151
See application file for complete search history.

(56) References Cited

U.S. PATENT DOCUMENTS

2012/0255709 A1 * 10/2012 Kinder .................. F28F 9/0075
　　　　　　　　　　　　　　　　　　　165/67
2023/0369842 A1 * 11/2023 Lau ........................... H02G 5/10

FOREIGN PATENT DOCUMENTS

CN　　　209516103 U　　10/2019
TW　　　202228352 A　　7/2022

* cited by examiner

*Primary Examiner* — Timothy J Thompson
*Assistant Examiner* — Guillermo J Egoavil
(74) *Attorney, Agent, or Firm* — Winston Hsu

(57)　　　　　　　ABSTRACT

An immersion cooling system includes a cooling tank, a busbar and a feedthrough module. The cooling tank includes a side wall and an opening formed on the side wall. The busbar is disposed in the cooling tank. The feedthrough module seals the opening. The feedthrough module includes a base, a conductive member, an insulating member and an electrical connector. The base is disposed on the side wall. The base has a through hole corresponding to the opening. The insulating member is disposed between the conductive member and the base to insulate the conductive member from the base. The electrical connector is connected to the conductive member. The electrical connector passes through the through hole and the opening to be connected to the busbar.

24 Claims, 15 Drawing Sheets

164

160

IMMERSION COOLING SYSTEM AND FEEDTHROUGH MODULE THEREOF

CROSS REFERENCE TO RELATED APPLICATIONS

This application is related to co-pending U.S. application Ser. No. 18/098,714, filed on Jan. 19, 2023, which is not admitted to be prior art with respect to the present invention by its mention in the cross-reference section. The contents of this application are incorporated herein by reference.

BACKGROUND OF THE INVENTION

1. Field of the Invention

The invention relates to an immersion cooling system and a feedthrough module thereof and, more particularly, to a feedthrough module capable of effectively achieve insulation and leakage-proof effects for an immersion cooling system.

2. Description of the Prior Art

An immersion cooling system uses a cooling liquid to dissipate heat from electronic components through a phase transition process. At present, some immersion cooling systems dispose a busbar in a cooling tank, so as to utilize the busbar to supply power for electronic components in the cooling tank. In general, the busbar is disposed at a bottom of the cooling tank and needs to be connected to a power shelf located outside the cooling tank. Since the cooling tank contains the cooling liquid and the busbar is part of a power distribution system, how to effectively achieve insulation and leakage-proof effects has become a significant design issue.

SUMMARY OF THE INVENTION

According to an embodiment of the invention, an immersion cooling system comprises a cooling tank, a busbar and a feedthrough module. The cooling tank comprises a side wall and an opening formed on the side wall. The busbar is disposed in the cooling tank. The feedthrough module seals the opening. The feedthrough module comprises a base, a conductive member, an insulating member and an electrical connector. The base is disposed on the side wall. The base has a through hole corresponding to the opening. The insulating member is disposed between the conductive member and the base to insulate the conductive member from the base. The electrical connector is connected to the conductive member. The electrical connector passes through the through hole and the opening to be connected to the busbar.

According to another embodiment of the invention, a feedthrough module comprises a base, a conductive member, an insulating member and an electrical connector. The base has a through hole. The insulating member is disposed between the conductive member and the base to insulate the conductive member from the base. The electrical connector is connected to the conductive member and passes through the through hole.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
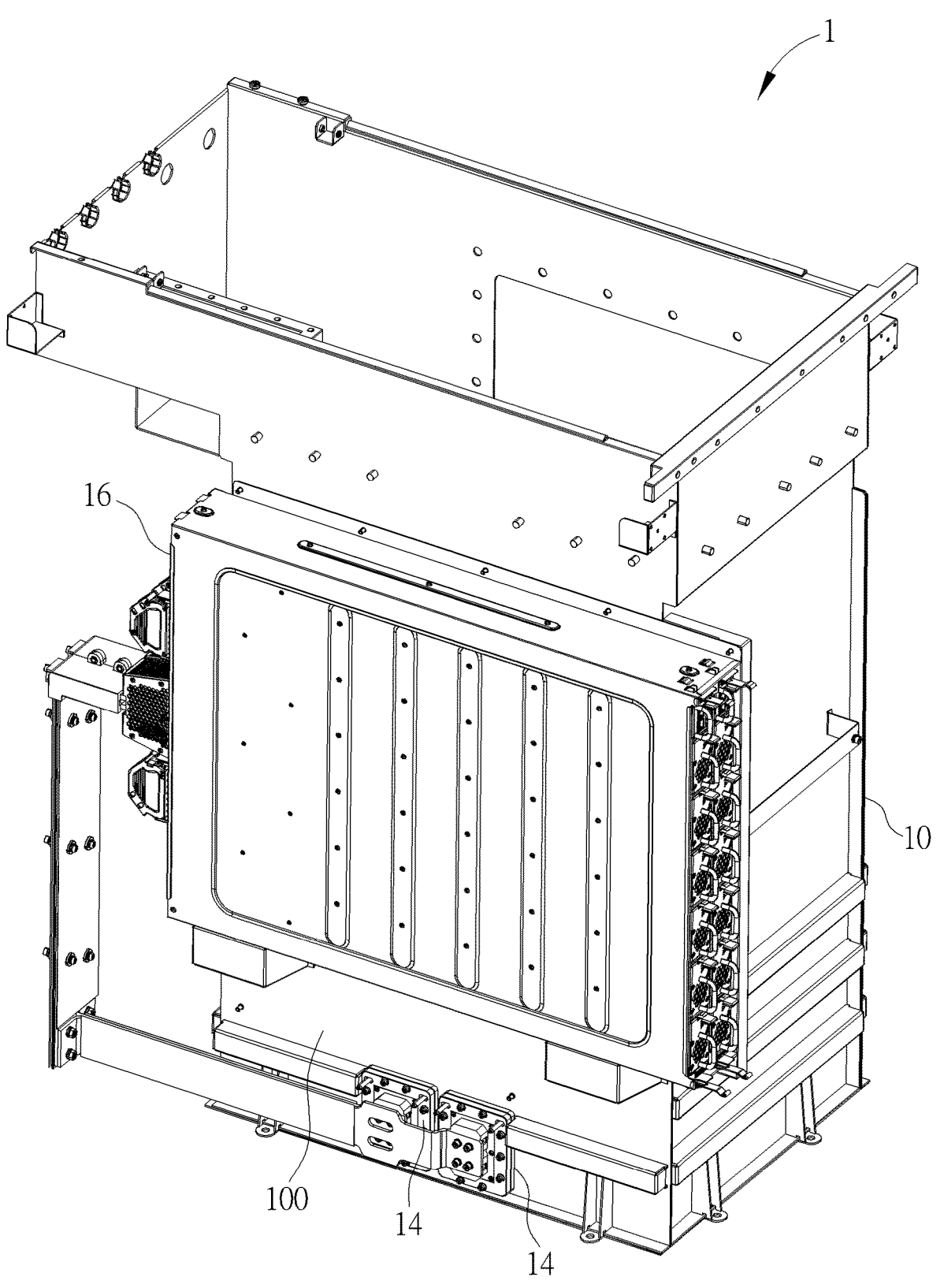
FIG. 1 is a perspective view illustrating an immersion cooling system according to an embodiment of the invention.
Figure 2:
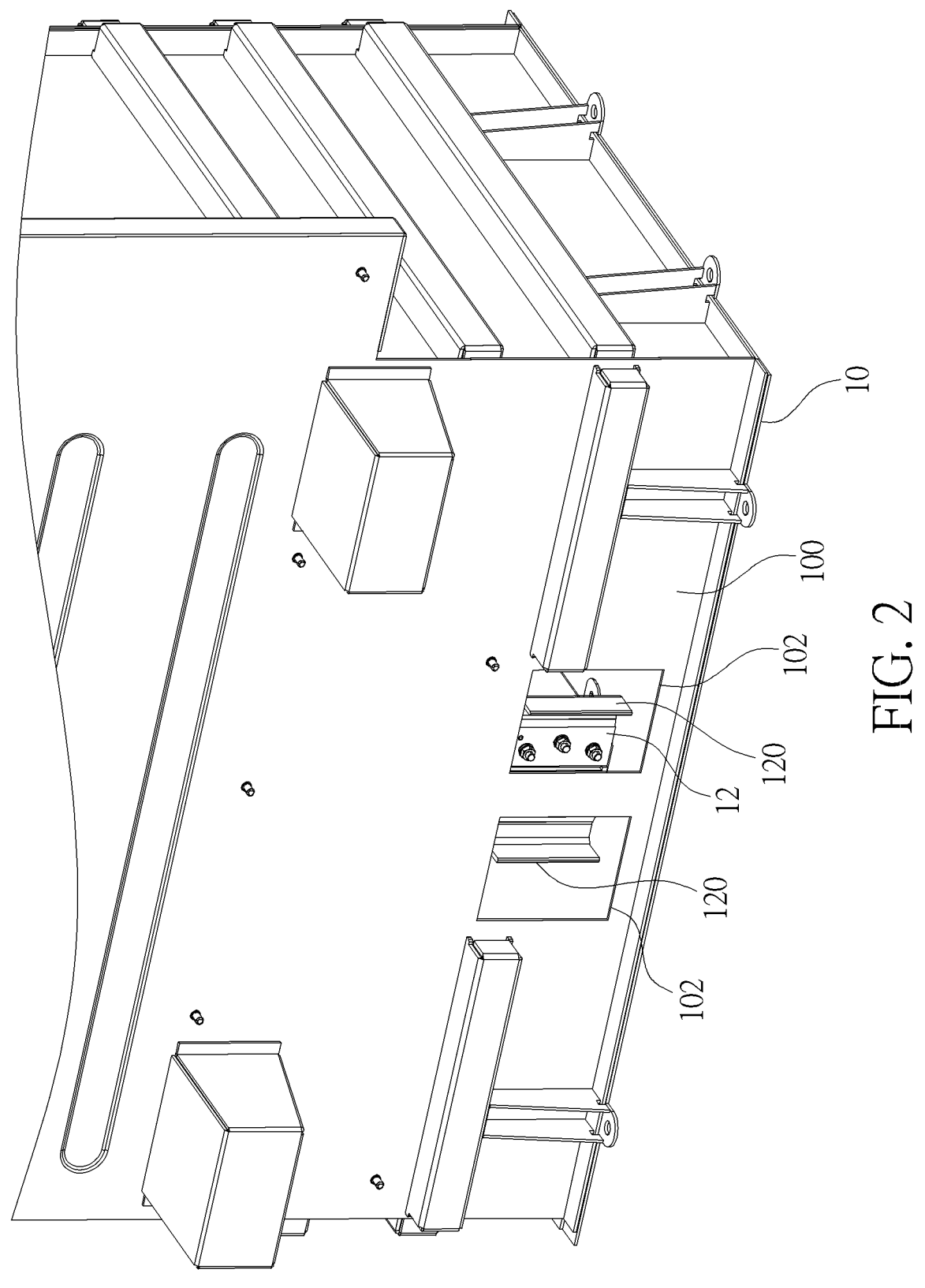
FIG. 2 is a partial perspective view illustrating a cooling tank shown in FIG. 1.
Figure 3:
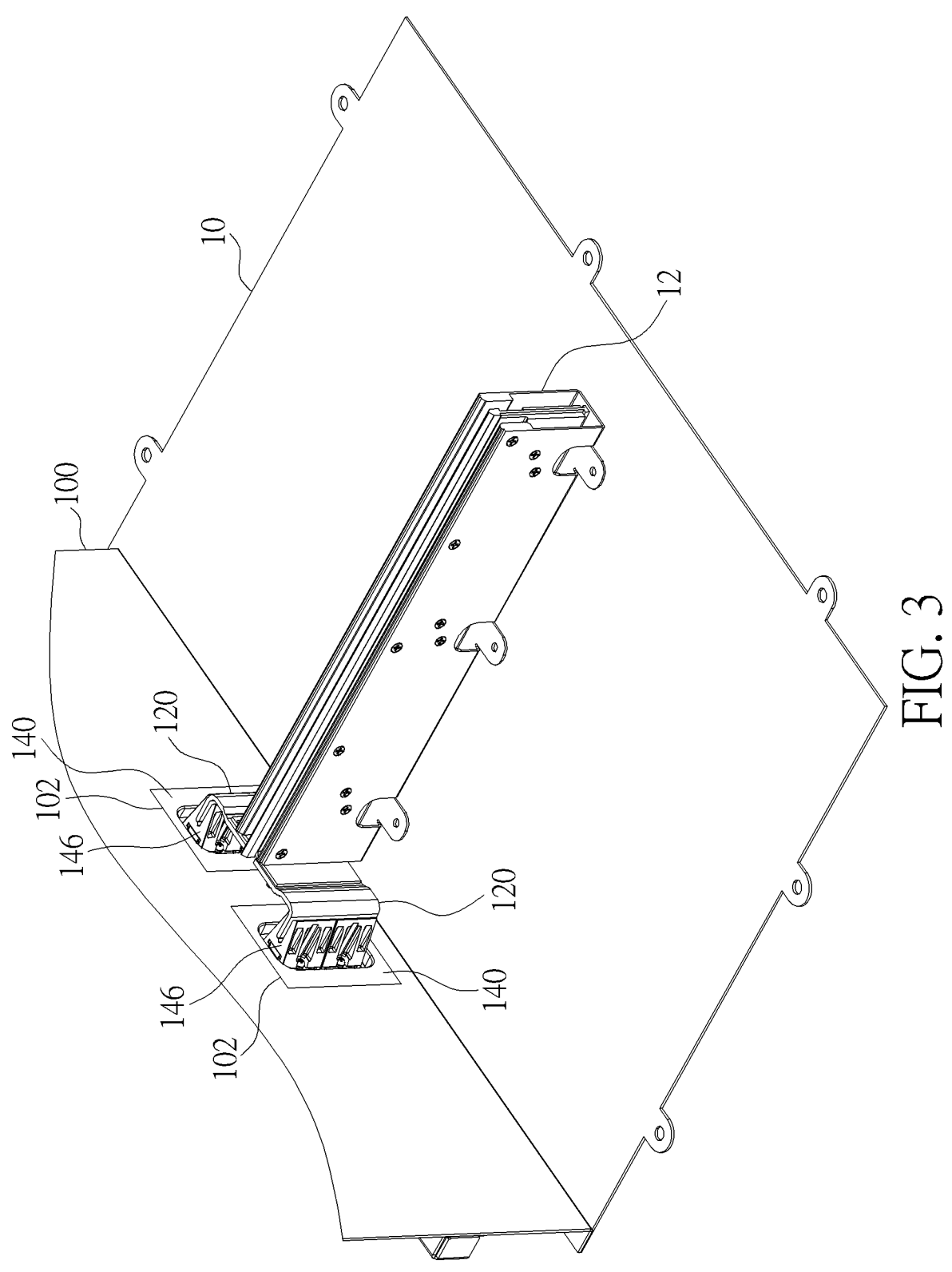
FIG. 3 is a partial perspective view illustrating an inside of the cooling tank shown in FIG. 1.
Figure 4:
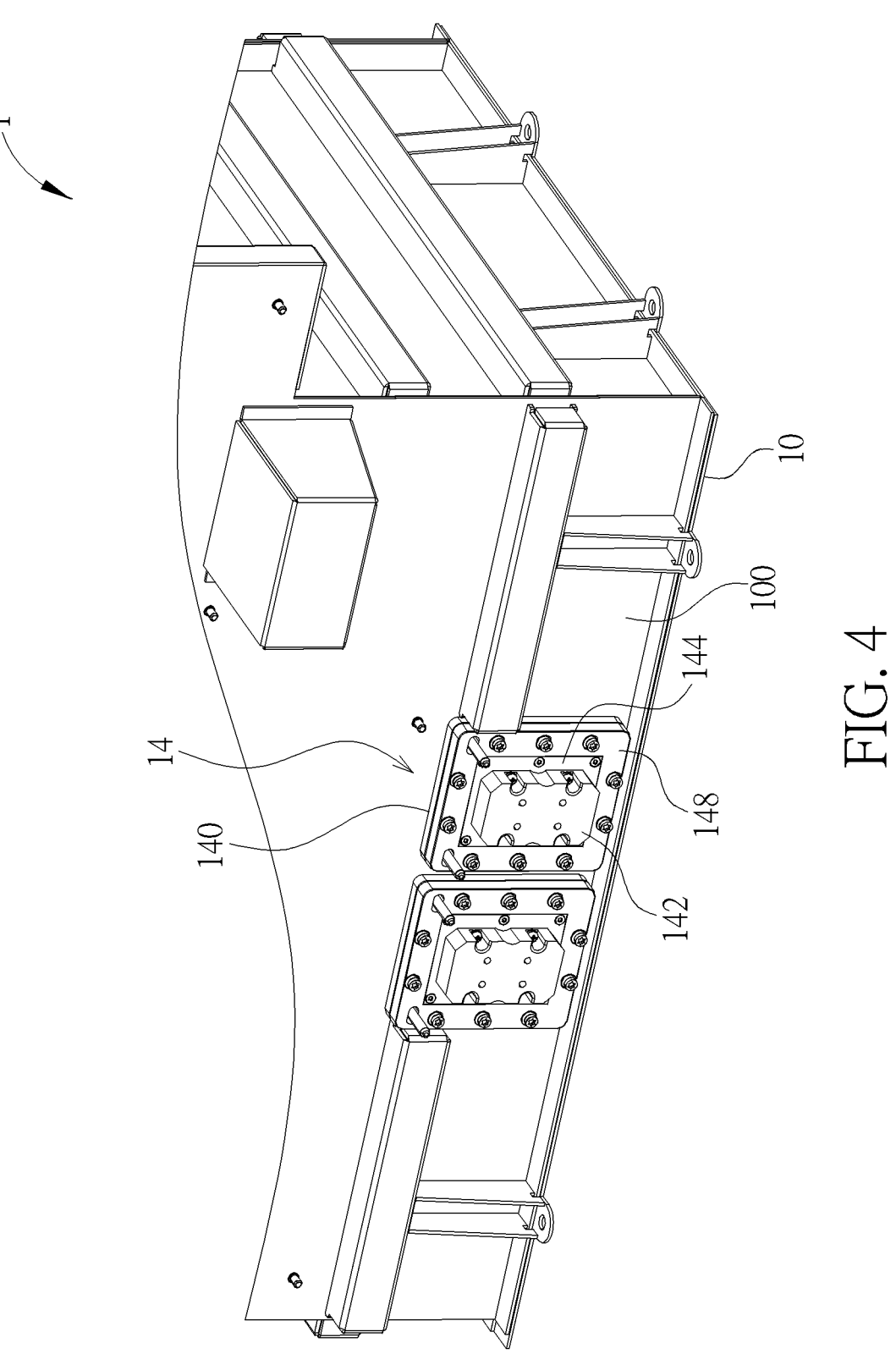
FIG. 4 is a partial perspective view illustrating two feedthrough modules disposed on the cooling tank shown in FIG. 1.
Figure 5:
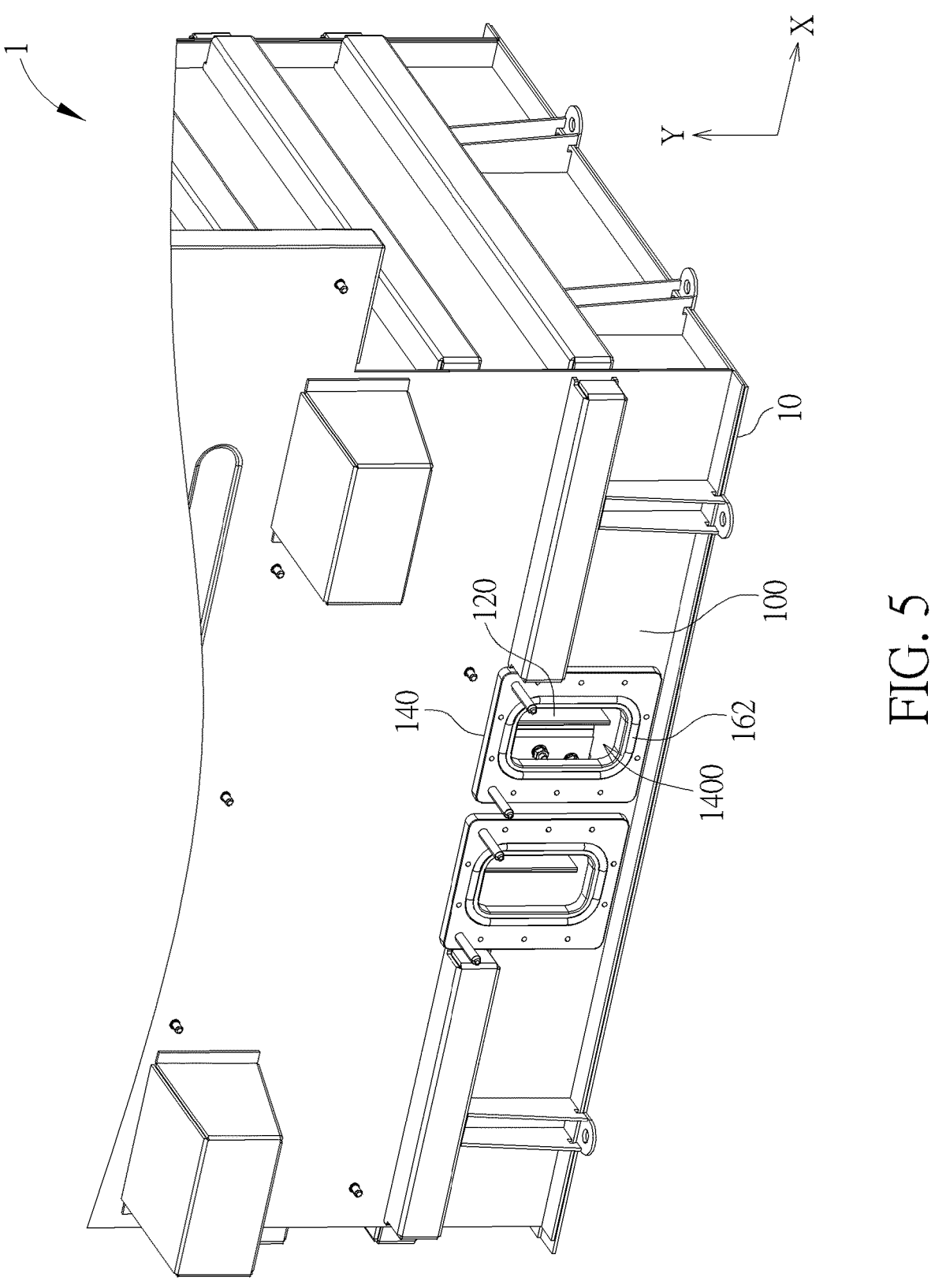
FIG. 5 is a partial perspective view illustrating two bases of the two feedthrough modules disposed on the cooling tank shown in FIG. 1.
Figure 6:
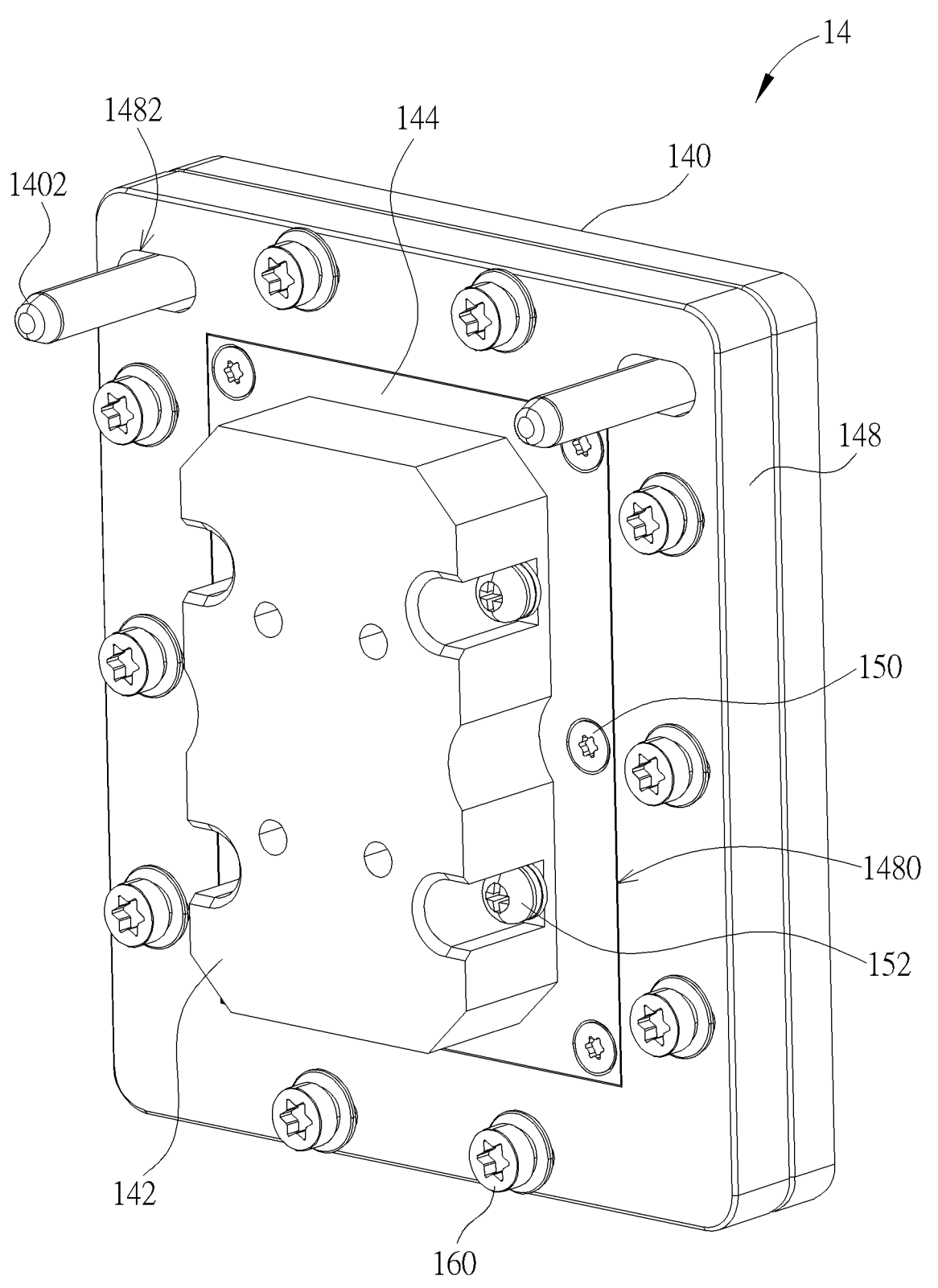
FIG. 6 is a perspective view illustrating the feedthrough module shown in FIG. 4.
Figure 8:
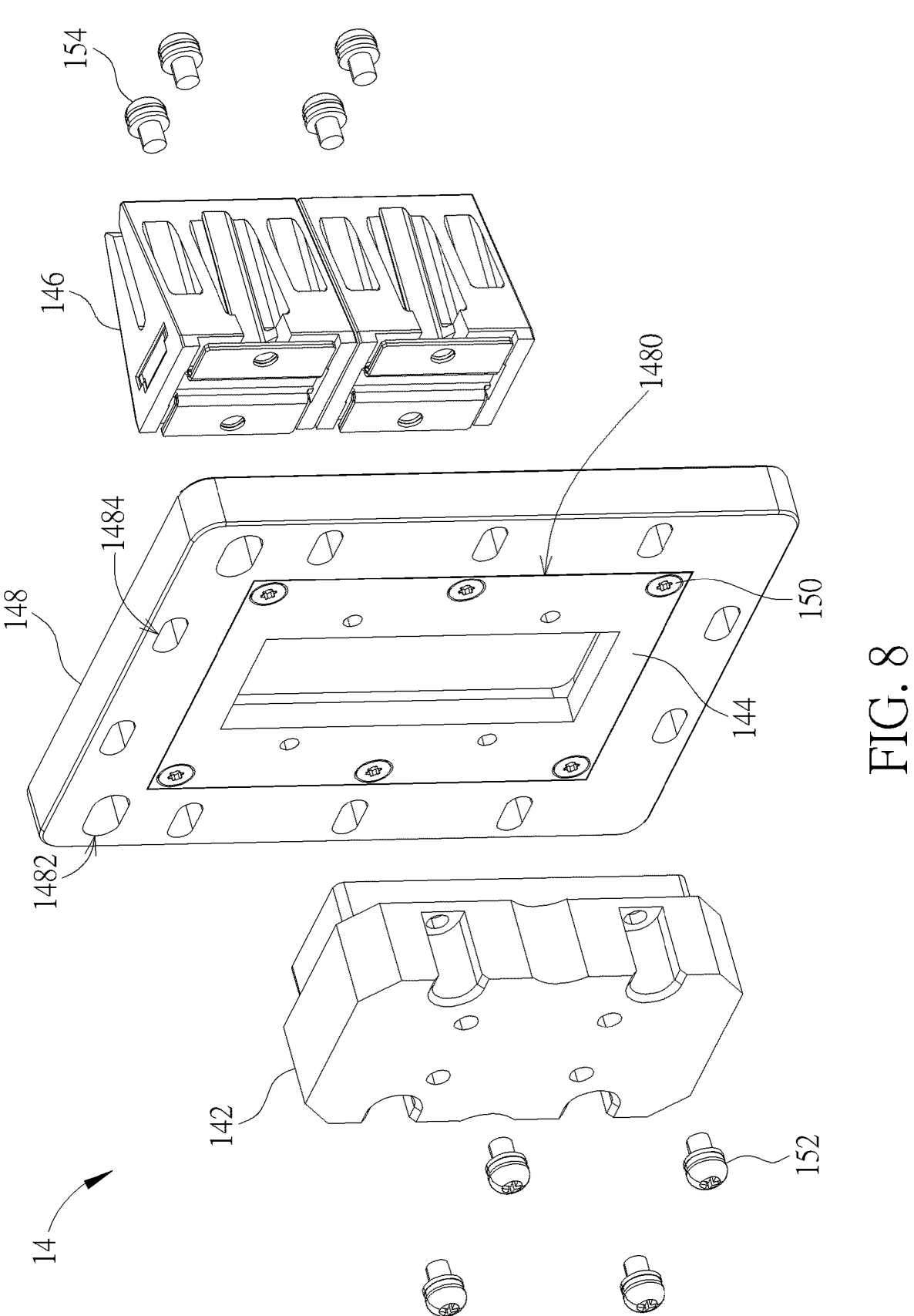
Figure 9:
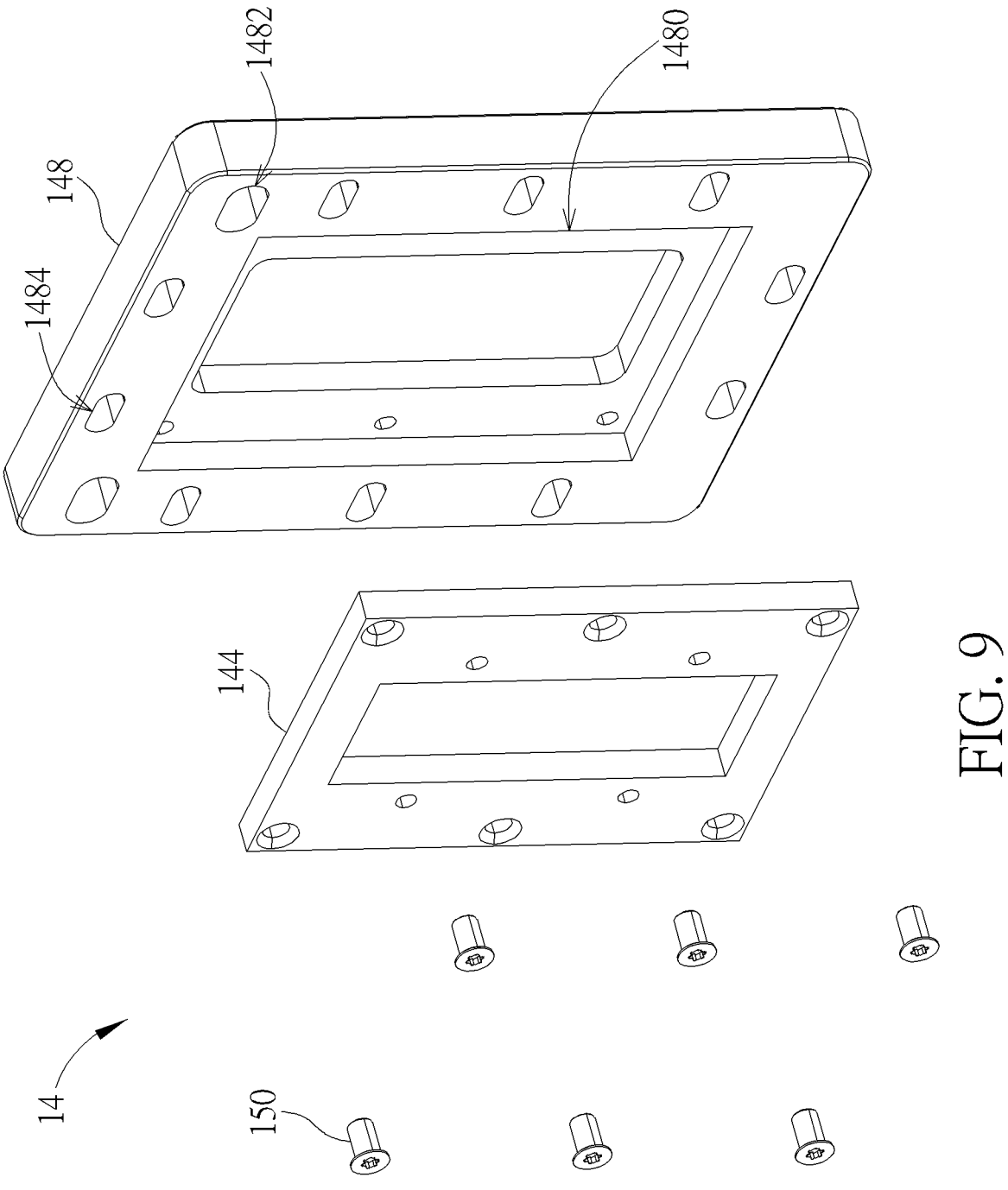
Figure 10:
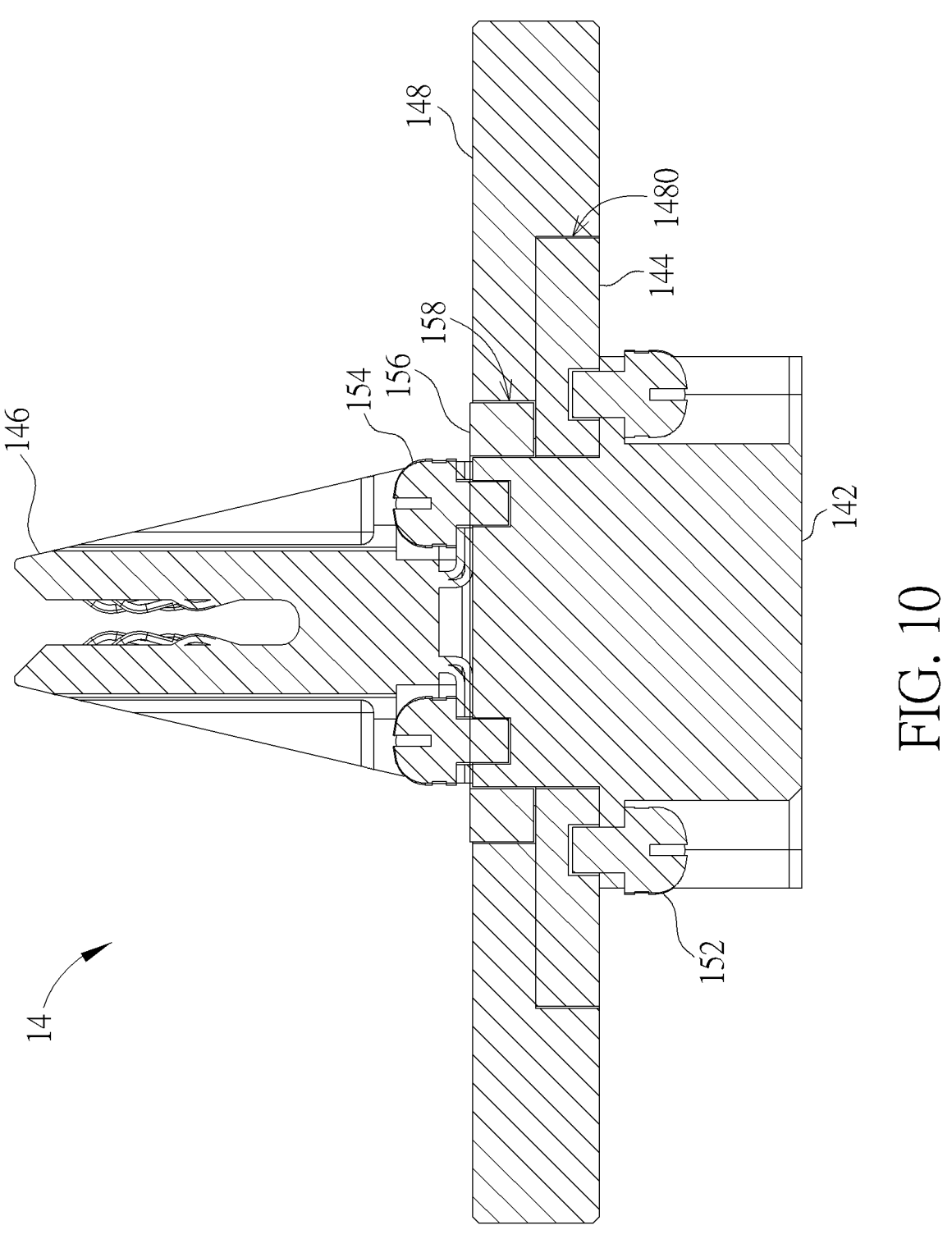
FIG. 10 is a sectional view illustrating the feedthrough module shown in FIG. 6 without the base.
Figure 11:
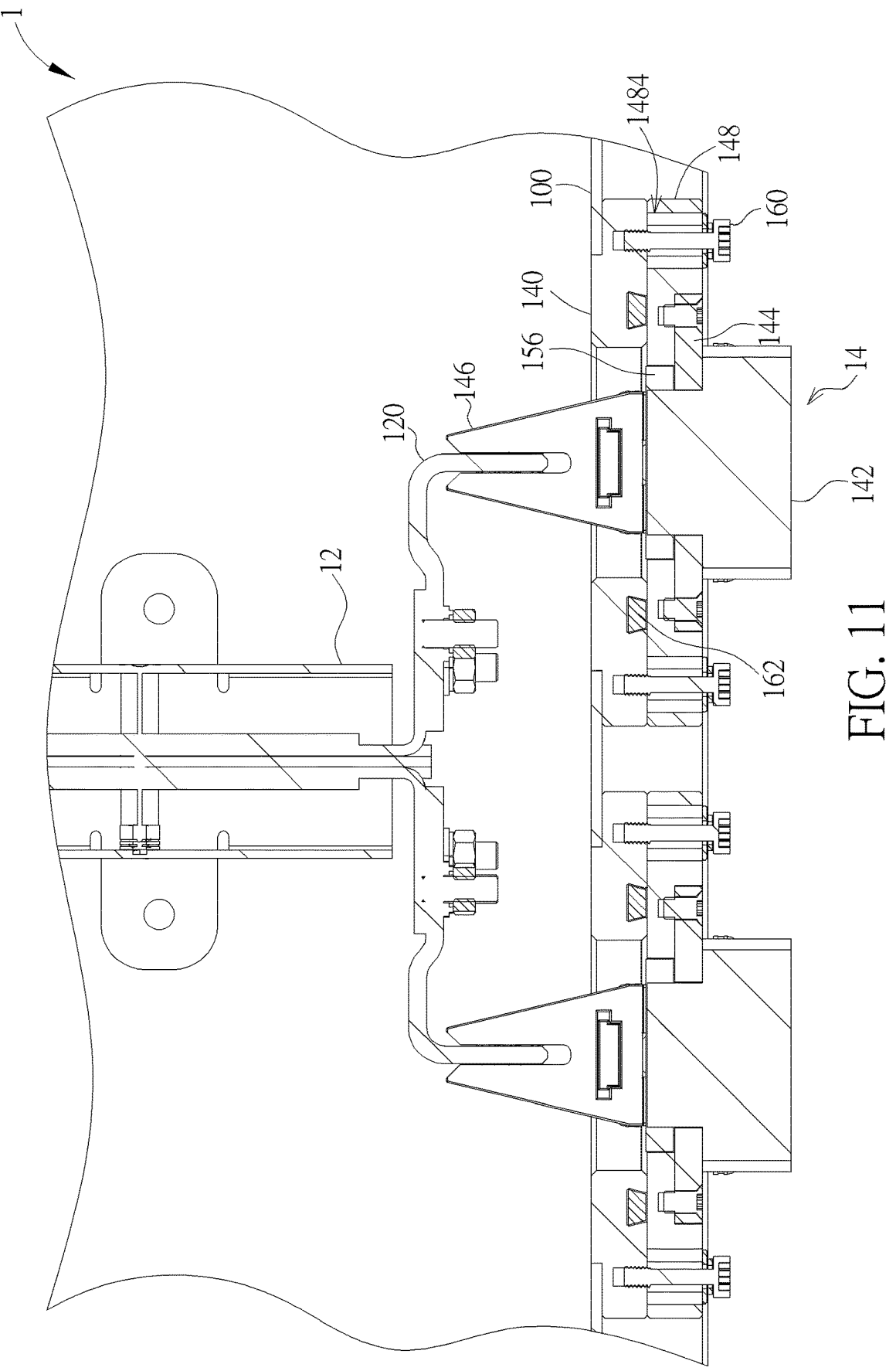
FIG. 11 is a partial sectional view illustrating the immersion cooling system shown in FIG. 4.

Referring to FIGS. 1 to 11, FIG. 1 is a perspective view illustrating an immersion cooling system 1 according to an embodiment of the invention, FIG. 2 is a partial perspective view illustrating a cooling tank 10 shown in FIG. 1, FIG. 3 is a partial perspective view illustrating an inside of the cooling tank 10 shown in FIG. 1, FIG. 4 is a partial perspective view illustrating two feedthrough modules 14 disposed on the cooling tank 10 shown in FIG. 1, FIG. 5 is a partial perspective view illustrating two bases 140 of the two feedthrough modules 14 disposed on the cooling tank 10 shown in FIG. 1, FIG. 6 is a perspective view illustrating the feedthrough module 14 shown in FIG. 4, FIGS. 7 to 9 are exploded views illustrating the feedthrough module 14 shown in FIG. 6, FIG. 10 is a sectional view illustrating the feedthrough module 14 shown in FIG. 6 without the base 140, and FIG. 11 is a partial sectional view illustrating the immersion cooling system 1 shown in FIG. 4.

As shown in FIGS. 1 to 4, the immersion cooling system 1 comprises a cooling tank 10, a busbar 12 and a feedthrough module 14. The cooling tank 10 may store a cooling liquid (e.g. dielectric liquid). An electronic device (e.g. server, not shown) may be immersed in the cooling liquid of the cooling tank 10, so as to dissipate the heat from the electronic device. This arrangement may be implemented in single-phase or two-phase immersion cooling system. For example, in some two-phase cooling applications, the cooling liquid may be provided with a low boiling point to evaporate into gas after absorbing the heat generated by the electronic device, so as to dissipate the heat from the electronic device. The busbar 12 is disposed in the cooling tank 10, as shown in FIG. 3. In this embodiment, the busbar 12 may be disposed at a bottom of the cooling tank 10 and configured to supply power for the electronic device. In this embodiment, the busbar 12 may be coupled to a power shelf 16 or the like located outside the cooling tank 10 through the feedthrough module 14, as shown in FIGS. 1 and 3. The power shelf 16 may be part of a centralized power distribution system for distributing power to electronic devices via the busbar 12. It should be noted that the number of the busbars 12 may be determined according to practical applications, so the invention is not limited to the embodiment shown in the figure.

The cooling tank 10 comprises a side wall 100 and an opening 102 formed on the side wall 100, as shown in FIG. 2. The feedthrough module 14 is configured to seal the opening 102, so as to prevent the cooling liquid of the cooling tank 10 from leaking. Furthermore, the feedthrough module 14 is further configured to electrically connect the busbar 12 with the power shelf 16. In this embodiment, the busbar 12 may have two connecting ends 120. Corresponding to the two connecting ends 120, two openings 102 may be formed on the side wall 100, and two feedthrough modules 14 may be disposed on the side wall 100 to seal the two openings 102 and connect the two connecting ends 120 of the busbar 12. That is to say, the number of the openings 102 and the feedthrough modules 14 may be determined according to the number of the connecting ends 120 of the busbar 12.

As shown in FIGS. 6 to 9, the feedthrough module 14 comprises a base 140, a conductive member 142, an insulating member 144 and an electrical connector 146. The base 140 may be made of metal or other suitable materials. The conductive member 142 may be made of copper or other conductive materials. The insulating member 144 may be made of plastic or other insulating materials. The electrical connector 146 may be, but is not limited to, a clip connector.

The base 140 is disposed on the side wall 100 of the cooling tank 10, and the base 140 has a through hole 1400 corresponding to the opening 102 on the side wall 100. In this embodiment, the base 140 may be disposed on the side wall 100 of the cooling tank 10 by welding, but the invention is not so limited. The insulating member 144 is disposed between the conductive member 142 and the base 140 to insulate the conductive member 142 from the base 140. In this embodiment, the feedthrough module 14 may further comprise a support member 148 fixed on the base 140, such that the insulating member 144 may be fixed on the support member 148, and the conductive member 142 may be fixed on the insulating member 144. Furthermore, the electrical connector 146 is connected to the conductive member 142. The support member 148 may be made of metal or other robust materials to enhance the structural strength of the feedthrough module 14. However, the support member 148 may also be made of plastic or other insulating materials according to practical applications.

Figure 7:
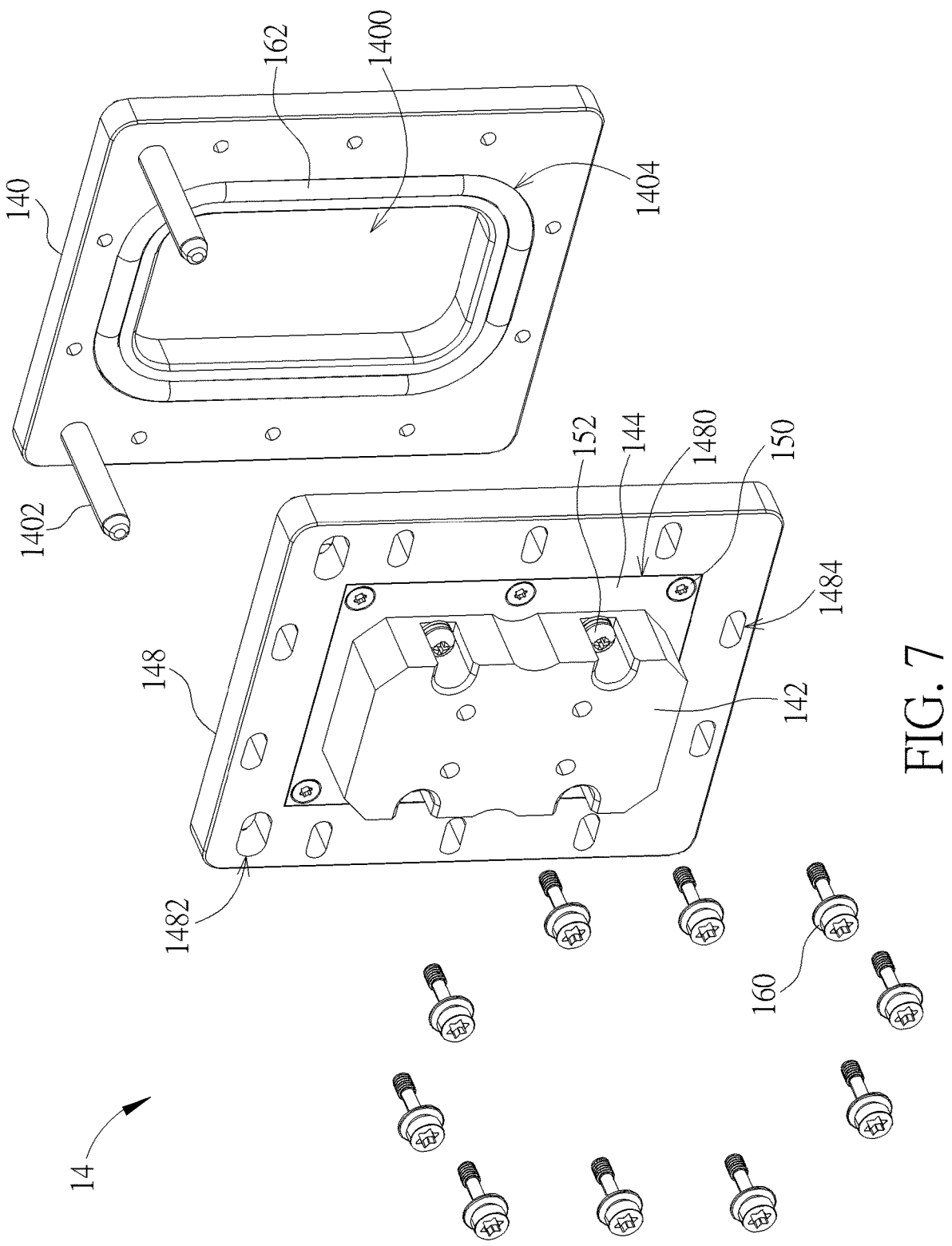
FIGS. 7 to 9 are exploded views illustrating the feedthrough module shown in FIG. 6.

As shown in FIGS. 8 and 9, the support member 148 may have an accommodating recess 1480 and the insulating member 144 may be accommodated in the accommodating recess 1480. Then, screws 150 or the like may be used to fix the insulating member 144 on the support member 148. Then, as shown in FIGS. 7 and 8, screws 152 or the like may be used to fix the conductive member 142 on the insulating member 144. Furthermore, screws 154 or the like may be used to fix the electrical connector 146 on the conductive member 142.

As shown in FIG. 10, the feedthrough module 14 may further comprise a sealing material 156 disposed in a gap 158 between the conductive member 142 and the support member 148. For further explanation, after assembling the conductive member 142, the insulating member 144, the electrical connector 146 and the support member 148, the gap 158 may be formed between the conductive member 142 and the support member 148. Thus, in this embodiment, the sealing material 156 may be disposed in the gap 158 for improving insulation and leakage-proof effects. The sealing material 156 may be sealant or the like.

To assemble the feedthrough module 14 to the cooling tank 10, the base 140 may be disposed on the side wall 100 first, as shown in FIG. 5. At this time, the through hole 1400 of the base 140 is aligned with the opening 102 on the side wall 100. Then, the support member 148 may be disposed on the base 140, and the electrical connector 146 of the feedthrough module 14 may pass through the through hole 1400 and the opening 102 to be connected to the busbar 12 inside the cooling tank 10.

In this embodiment, the base 140 may have two guiding portions 1402 and the support member 148 may have two guiding holes 1482. When the support member 148 is disposed on the base 140, the two guiding portions 1402 are inserted into the two guiding holes 1482 to assemble the support member 148 to the base 140, so as to position the support member 148 on the base 140 and ensure the alignment between the electrical connector 146 of the feedthrough module 14 and the connecting end 120 of the busbar 12 in a vertical direction Y (as shown in FIG. 5).

As shown in FIG. 7, the two guiding portions 1402 are located at the top of the base 140. In another embodiment, the two guiding portions 1402 may be located at the bottom, middle, diagonal, vertical, horizontal or any suitable positions of the base 140 according to practical applications. Furthermore, the positions of the two guiding holes 1482 correspond to the positions of the two guiding portions 1402. Thus, the invention is not limited to the embodiment shown in the figure.

In this embodiment, the feedthrough module 14 may further comprise a plurality of fixing members 160 and the support member 148 may have a plurality of fixing holes 1484. After the support member 148 is disposed on the base 140, the fixing members 160 may be fixed to the base 140 through the fixing holes 1484, so as to fix the support member 148 on the base 140. The fixing members 160 may be, but are not limited to, anti-drop screws. In this embodiment, the fixing holes 1484 and the guiding holes 1482 may be, but are not limited to, elongated holes. After the support member 148 is disposed on the base 140 and before the fixing members 160 is completely fixed, the fixing holes 1484 and the guiding holes 1482 allow the support member 148 to move with respect to the fixing members 160 and the guiding portions 1402 in a horizontal direction X (as shown in FIG. 5), so as to align the electrical connector 146 of the feedthrough module 14 with the connecting end 120 of the busbar 12 in the horizontal direction X. Then, after the electrical connector 146 of the feedthrough module 14 is connected to the connecting end 120 of the busbar 12, the fixing members 160 can be completely fixed.

As shown in FIGS. 7 and 11, the base 140 may have a groove 1404 surrounding the through hole 1400, and the feedthrough module 14 may further comprise a sealing member 162 disposed in the groove 1404. After the fixing members 160 are completely fixed, the support member 148 will compress the sealing member 162. Accordingly, the support member 148 will tightly abut against the sealing member 162 as being fixed on the base 140, so as to achieve leakage-proof effect. The sealing member 162 may be an O-ring or the like. Furthermore, as shown in FIG. 11, since the insulating member 144 is disposed between the conductive member 142 and the base 140, the insulating member 144 insulates the conductive member 142 from the base 140, so as to ensure electricity safety.

Figure 12:
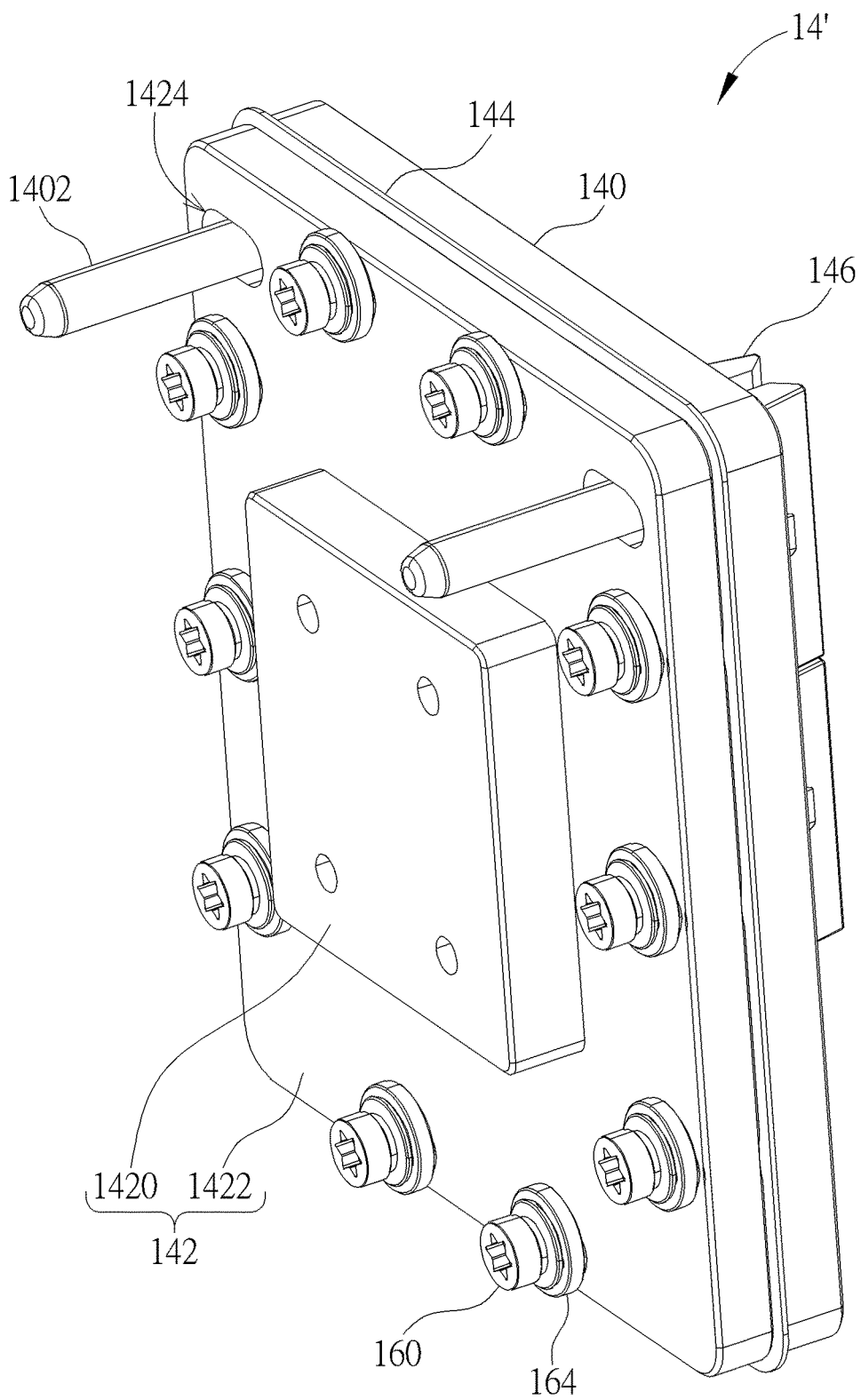
FIG. 12 is a perspective view illustrating a feedthrough module according to another embodiment of the invention.
Figure 13:
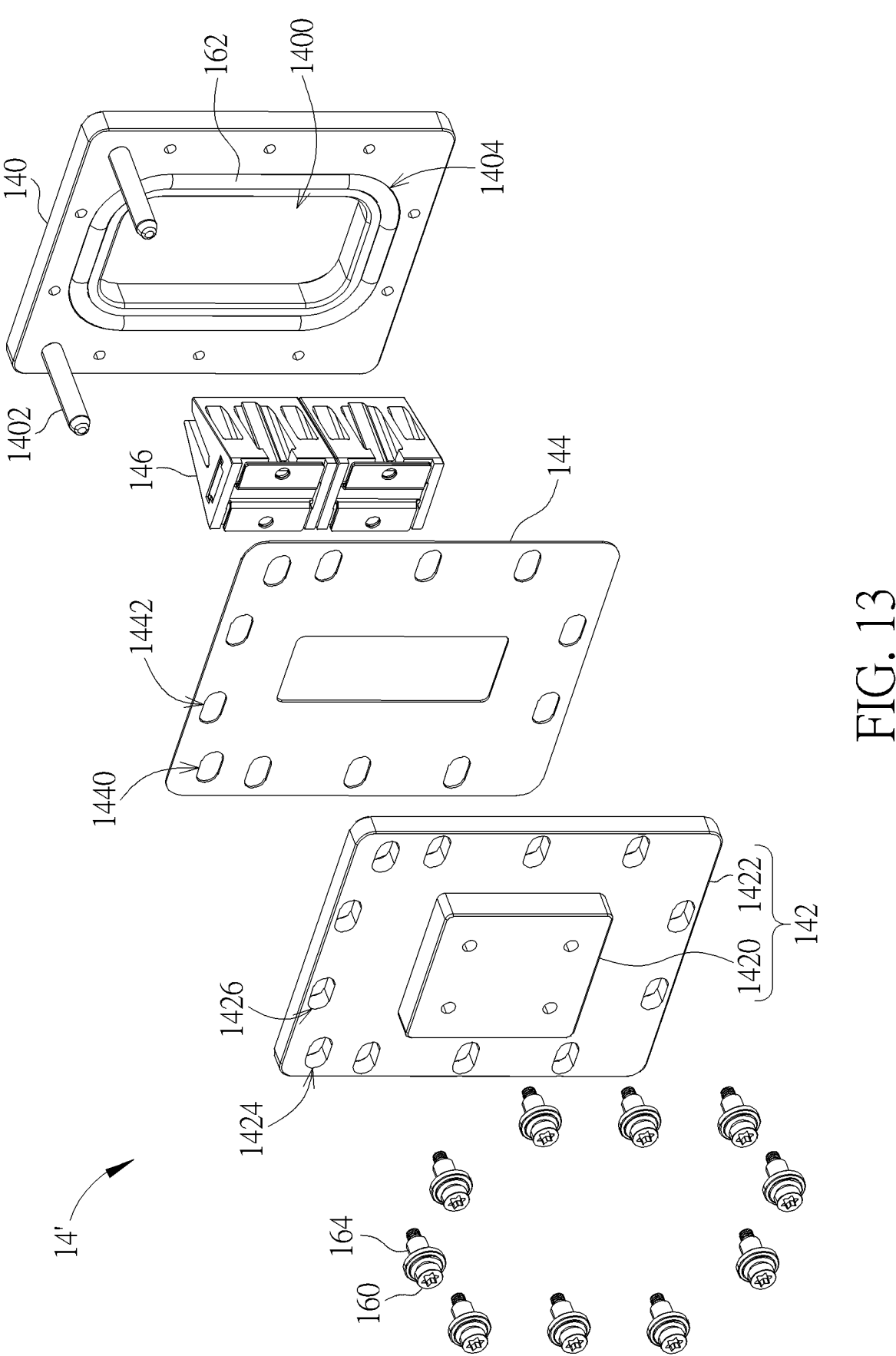
FIG. 13 is an exploded view illustrating the feedthrough module shown in FIG. 12.
Figure 14:
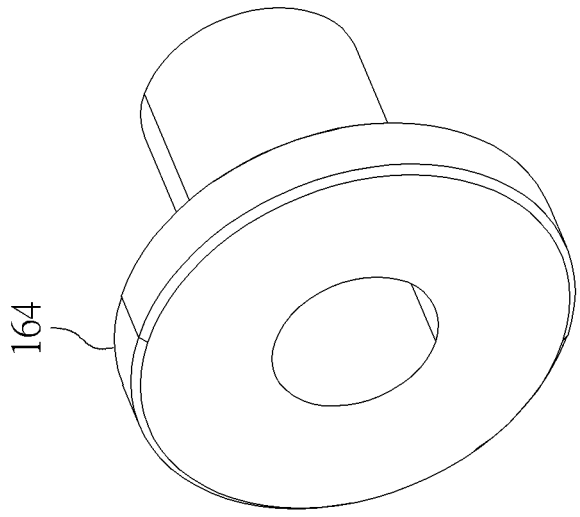
FIG. 14 is an exploded view illustrating a fixing member and an insulating bushing shown in FIG. 13.
Figure 14:
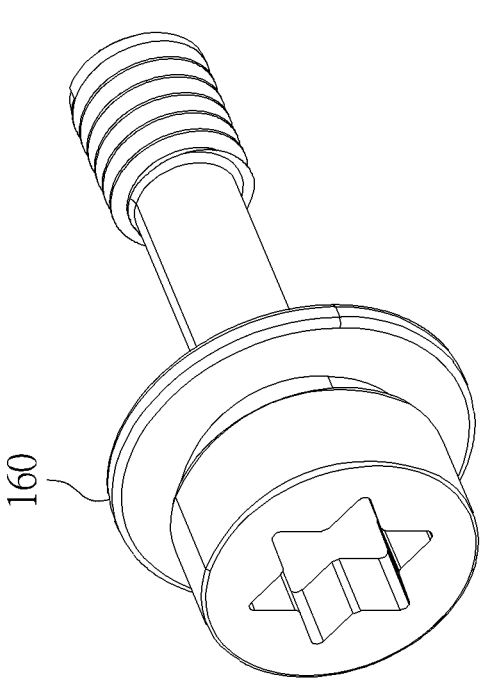
Figure 15:
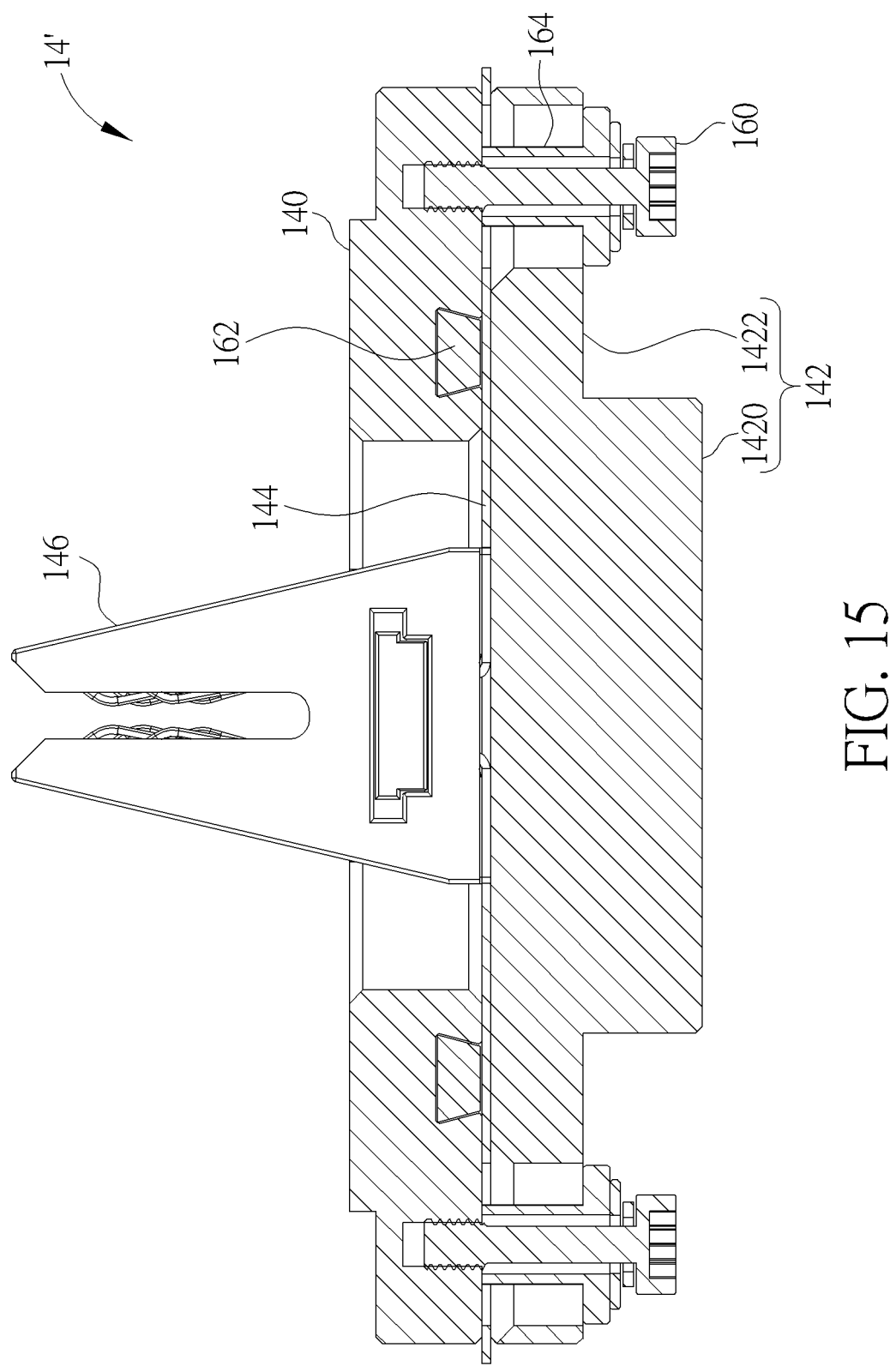
FIG. 15 is a sectional view illustrating the feedthrough module shown in FIG. 12.

Referring to FIGS. 12 to 15, FIG. 12 is a perspective view illustrating a feedthrough module 14' according to another embodiment of the invention, FIG. 13 is an exploded view illustrating the feedthrough module 14' shown in FIG. 12, FIG. 14 is an exploded view illustrating a fixing member 160 and an insulating bushing 164 shown in FIG. 13, and FIG. 15 is a sectional view illustrating the feedthrough module 14' shown in FIG. 12.

The main difference between the feedthrough module 14' and the aforesaid feedthrough module 14 is that the insulating member 144 of the feedthrough module 14' is sandwiched in between the base 140 and the conductive member 142, and opposite sides of the insulating member 144 are respectively in contact with the base 140 and the conductive member 142, as shown in FIGS. 12 and 15.

In this embodiment, the conductive member 142 may have a central portion 1420 and a peripheral portion 1422 surrounding the central portion 1420, wherein the central portion 1420 may protrude from the peripheral portion 1422. The electrical connector 146 may be connected to the central portion 1420. The central portion 1420 may be used for power transmission, and the peripheral portion 1422 may be used for attaching to the insulating member 144. To prevent accidental contact with the central portion 1420, a surface of the peripheral portion 1422 may be coated with an insulating material to improve the insulation effect for the central portion 1420. In another embodiment, the placement of the insulating member 144 between the conductive member 142 and the base 140, as well as the application of insulating material to the surface of the peripheral portion 1422, may be optional according to practical applications.

In this embodiment, the base 140 may have two guiding portions 1402, the conductive member 142 may have two first guiding holes 1424, and the insulating member 144 may have two second guiding holes 1440. When the insulating member 144 and the conductive member 142 are disposed on the base 140, the two guiding portions 1402 are inserted into the two second guiding holes 1440 and the two first guiding holes 1424 to assemble the insulating member 144 and the conductive member 142 to the base 140, so as to position the insulating member 144 and the conductive member 142 on the base 140 and ensure the alignment between the electrical connector 146 of the feedthrough module 14' and the connecting end 120 of the busbar 12 in a vertical direction Y (as shown in FIG. 5).

In this embodiment, the feedthrough module 14' may further comprise a plurality of fixing members 160 and a plurality of insulating bushings 164, wherein the insulating bushings 164 are respectively sleeved on the fixing members 160, as shown in FIGS. 13 and 14. Furthermore, the conductive member 142 may have a plurality of first fixing holes 1426 and the insulating member 144 may have a plurality of second fixing holes 1442. After the insulating member 144 and the conductive member 142 are disposed on the base 140, the fixing members 160 may be fixed to the base 140 through the first fixing holes 1426 and the second fixing holes 1442, so as to fix the conductive member 142 and the insulating member 144 on the base 140. The fixing members 160 may be, but are not limited to, anti-drop screws. In this embodiment, the first fixing holes 1426, the second fixing holes 1442, the first guiding holes 1424 and the second guiding holes 1440 may be, but are not limited to, elongated holes. After the insulating member 144 and the conductive member 142 are disposed on the base 140 and before the fixing members 160 is completely fixed, the first fixing holes 1426, the second fixing holes 1442, the first guiding holes 1424 and the second guiding holes 1440 allow the conductive member 142 and the insulating member 144 to move with respect to the fixing members 160 and the guiding portions 1402 in a horizontal direction X (as shown in FIG. 5), so as to align the electrical connector 146 of the feedthrough module 14' with the connecting end 120 of the busbar 12 in the horizontal direction X. Then, after the electrical connector 146 of the feedthrough module 14' is connected to the connecting end 120 of the busbar 12, the fixing members 160 can be completely fixed. Since the insulating bushings 164 are respectively sleeved on the fixing members 160, the insulating bushings 164 insulate the fixing members 160 from the conductive member 142, so as to improve insulation effect.

As shown in FIGS. 13 and 15, the base 140 may have a groove 1404 surrounding the through hole 1400, and the feedthrough module 14' may further comprise a sealing member 162 disposed in the groove 1404. After the fixing members 160 are completely fixed, the insulating member 144 will compress the sealing member 162. Accordingly, the insulating member 144 will tightly abut against the sealing member 162 as being fixed on the base 140, so as to achieve leakage-proof effect. The sealing member 162 may be an O-ring or the like. Furthermore, as shown in FIG. 15, since the insulating member 144 is disposed between the conductive member 142 and the base 140, the insulating member 144 insulates the conductive member 142 from the base 140, so as to ensure electricity safety.

It should be noted that the same elements in FIGS. 1-11 and FIGS. 12-15 are represented by the same numerals, so the repeated explanation will not be depicted herein again.

As mentioned in the above, the insulating member is disposed between the conductive member and the base to insulate the conductive member from the base, so as to ensure electricity safety. Furthermore, the base may be equipped with the sealing member to achieve leakage-proof effect. Moreover, the feedthrough module (except the base) may be rapidly assembled to or disassembled from the cooling tank by the fixing members, which is convenient for maintenance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An immersion cooling system comprising:
   a cooling tank comprising a side wall and an opening formed on the side wall;
   a busbar disposed in the cooling tank; and
   a feedthrough module sealing the opening, the feedthrough module comprising:
     a base disposed on the side wall, the base having a through hole corresponding to the opening, the through hole penetrating two opposite surfaces of the base;
     a conductive member;
     an insulating member disposed between the conductive member and the base to insulate the conductive member from the base, the insulating member isolating the conductive member from the base; and
     an electrical connector connected to the conductive member, the electrical connector passing through the through hole and the opening to be connected to the busbar.

2. The immersion cooling system of claim 1, wherein the feedthrough module further comprises a support member fixed on the base, the insulating member is fixed on the support member, and the conductive member is fixed on the insulating member.

3. The immersion cooling system of claim 2, wherein the support member has an accommodating recess and the insulating member is accommodated in the accommodating recess.

4. The immersion cooling system of claim 2, wherein the feedthrough module further comprises a sealing material disposed in a gap between the conductive member and the support member.

5. The immersion cooling system of claim 2, wherein the base has two guiding portions, the support member has two guiding holes, and the two guiding portions are inserted into the two guiding holes to assemble the support member to the base.

6. The immersion cooling system of claim 2, wherein the base has a groove surrounding the through hole, the feedthrough module further comprises a sealing member disposed in the groove, and the support member tightly abuts against the sealing member as being fixed on the base.

7. The immersion cooling system of claim 2, wherein the feedthrough module further comprises a plurality of fixing members, the support member has a plurality of fixing holes, and the plurality of fixing members are fixed to the base through the plurality of fixing holes, so as to fix the support member on the base.

8. The immersion cooling system of claim 1, wherein the insulating member is sandwiched in between the base and the conductive member, and opposite sides of the insulating member are respectively in contact with the base and the conductive member.

9. The immersion cooling system of claim 8, wherein the conductive member has a central portion and a peripheral portion surrounding the central portion, the electrical connector is connected to the central portion, and a surface of the peripheral portion is coated with an insulating material.

10. The immersion cooling system of claim 8, wherein the base has two guiding portions, the conductive member has two first guiding holes, the insulating member has two second guiding holes, and the two guiding portions are inserted into the two second guiding holes and the two first guiding holes to assemble the insulating member and the conductive member to the base.

11. The immersion cooling system of claim 8, wherein the base has a groove surrounding the through hole, the feedthrough module further comprises a sealing member disposed in the groove, and the insulating member tightly abuts against the sealing member as being fixed on the base.

12. The immersion cooling system of claim 8, wherein the feedthrough module further comprises a plurality of fixing members, the conductive member has a plurality of first fixing holes, the insulating member has a plurality of second fixing holes, and the plurality of fixing members are fixed to the base through the plurality of first fixing holes and the plurality of second fixing holes, so as to fix the conductive member and the insulating member on the base.

13. The immersion cooling system of claim 12, wherein the feedthrough module further comprises a plurality of insulating bushings sleeved on the plurality of fixing members to insulate the plurality of fixing members from the conductive member.

14. A feedthrough module comprising:
a base having a through hole;
a conductive member having a central portion and a peripheral portion surrounding the central portion, a surface of the peripheral portion being coated with an insulating material;
an insulating member sandwiched in between the conductive member and the base to insulate the conductive member from the base, opposite sides of the insulating member being respectively in contact with the base and the conductive member; and
an electrical connector connected to the central portion of the conductive member and passing through the through hole.

15. The feedthrough module of claim 14, wherein the base has two guiding portions, the conductive member has two first guiding holes, the insulating member has two second guiding holes, and the two guiding portions are inserted into the two second guiding holes and the two first guiding holes to assemble the insulating member and the conductive member to the base.

16. The feedthrough module of claim 14, wherein the base has a groove surrounding the through hole, the feedthrough module further comprises a sealing member disposed in the groove, and the insulating member tightly abuts against the sealing member as being fixed on the base.

17. The feedthrough module of claim 14, further comprising a plurality of fixing members, wherein the conductive member has a plurality of first fixing holes, the insulating member has a plurality of second fixing holes, and the plurality of fixing members are fixed to the base through the plurality of first fixing holes and the plurality of second fixing holes, so as to fix the conductive member and the insulating member on the base.

18. The feedthrough module of claim 17, further comprising a plurality of insulating bushings sleeved on the plurality of fixing members to insulate the plurality of fixing members from the conductive member.

19. A feedthrough module comprising:
a base having a through hole;
a support member fixed on the base;
an insulating member fixed on the support member;
a conductive member fixed on the insulating member; and
an electrical connector connected to the conductive member and passing through the through hole;
wherein the insulating member is disposed between the conductive member and the base to insulate the conductive member from the base.

20. The feedthrough module of claim 19, wherein the support member has an accommodating recess and the insulating member is accommodated in the accommodating recess.

21. The feedthrough module of claim 19, further comprising a sealing material disposed in a gap between the conductive member and the support member.

22. The feedthrough module of claim 19, wherein the base has two guiding portions, the support member has two guiding holes, and the two guiding portions are inserted into the two guiding holes to assemble the support member to the base.

23. The feedthrough module of claim 19, wherein the base has a groove surrounding the through hole, the feedthrough module further comprises a sealing member disposed in the groove, and the support member tightly abuts against the sealing member as being fixed on the base.

24. The feedthrough module of claim 19, further comprising a plurality of fixing members, wherein the support member has a plurality of fixing holes, and the plurality of fixing members are fixed to the base through the plurality of fixing holes, so as to fix the support member on the base.

* * * * *